United States Patent
Su et al.

(10) Patent No.: US 9,356,132 B2
(45) Date of Patent: *May 31, 2016

(54) INTEGRATING SCHOTTKY DIODE INTO POWER MOSFET

(71) Applicant: Alpha and Omega Semiconductor Incorporated, Sunnyvale, CA (US)

(72) Inventors: Yi Su, Cupertino, CA (US); Daniel Ng, Campbell, CA (US); Anup Bhalla, Santa Clara, CA (US); Hong Chang, Saratoga, CA (US); Jongoh Kim, Portland, OR (US); John Chen, Palo Alto, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/318,408

(22) Filed: Jun. 27, 2014

(65) Prior Publication Data

US 2016/0005853 A1    Jan. 7, 2016

Related U.S. Application Data

(60) Continuation of application No. 13/948,988, filed on Jul. 23, 2013, now Pat. No. 8,785,270, which is a division of application No. 13/098,852, filed on May 2, 2011, now Pat. No. 8,502,302.

(51) Int. Cl.
*H01L 29/66* (2006.01)
*H01L 21/8234* (2006.01)
(Continued)

(52) U.S. Cl.
CPC ........ *H01L 29/7801* (2013.01); *H01L 29/0891* (2013.01); *H01L 29/407* (2013.01);
(Continued)

(58) Field of Classification Search
CPC .......................... H01L 29/0891; H01L 29/872
USPC ................. 438/178, 237, 270, 268; 257/284, 257/327–334

See application file for complete search history.

(56) References Cited

U.S. PATENT DOCUMENTS 4,646,115 A    2/1987  Shannon et al.
6,509,233 B2   1/2003  Chang et al.
(Continued)

OTHER PUBLICATIONS

Non Final Office Action for U.S. Appl. No. 13/098,852, dated Dec. 5, 2012.

(Continued)

*Primary Examiner* — Calvin Lee
(74) *Attorney, Agent, or Firm* — Joshua D. Isenberg; JDI Patent

(57) ABSTRACT

A semiconductor device includes a plurality of trenches including active gate trenches in an active area and gate runner/termination trenches and shield electrode pickup trenches in a termination area outside the active area. The gate runner/termination trenches include one or more trenches that define a mesa located outside an active area. A first conductive region is formed in the plurality of trenches. An intermediate dielectric region and termination protection region are formed in the trenches that define the mesa. A second conductive region is formed in the portion of the trenches that define the mesa. The second conductive region is electrically isolated from the first conductive region by the intermediate dielectric region. A first electrical contact is made to the second conductive regions and a second electrical contact to the first conductive region in the shield electrode pickup trenches. One or more Schottky diodes are formed within the mesa.

14 Claims, 23 Drawing Sheets

(51) Int. Cl.
  *H01L 29/78* (2006.01)
  *H01L 29/872* (2006.01)
  *H01L 29/40* (2006.01)
  *H01L 29/08* (2006.01)
  *H01L 21/265* (2006.01)
  *H01L 29/417* (2006.01)
  *H01L 29/423* (2006.01)
  *H01L 29/47* (2006.01)
  *H01L 29/49* (2006.01)
  *H01L 29/06* (2006.01)

(52) U.S. Cl.
  CPC .... *H01L29/66719* (2013.01); *H01L 29/66727* (2013.01); *H01L 29/66734* (2013.01); *H01L 29/78* (2013.01); *H01L 29/782* (2013.01); *H01L 29/7806* (2013.01); *H01L 29/7811* (2013.01); *H01L 29/7813* (2013.01); *H01L 29/872* (2013.01); *H01L 21/26586* (2013.01); *H01L 29/0623* (2013.01); *H01L 29/0696* (2013.01); *H01L 29/41766* (2013.01); *H01L 29/4238* (2013.01); *H01L 29/42368* (2013.01); *H01L 29/47* (2013.01); *H01L 29/4933* (2013.01)

(56) References Cited

U.S. PATENT DOCUMENTS

| | | | |
|---|---|---|---|
| 6,987,305 B2 | 1/2006 | He et al. | |
| 7,285,822 B2 | 10/2007 | Bhalla | |
| 7,436,022 B2 | 10/2008 | Bhalla | |
| 7,446,374 B2 | 11/2008 | Thorup et al. | |
| 7,449,354 B2 | 11/2008 | Marchant et al. | |
| 7,453,119 B2 | 11/2008 | Bhalla | |
| 7,564,099 B2 | 7/2009 | He et al. | |
| 7,605,425 B2 | 10/2009 | Bhalla | |
| 7,750,447 B2 | 7/2010 | Chang et al. | |
| 7,767,526 B1 | 8/2010 | Lee | |
| 7,799,646 B2 | 9/2010 | Su et al. | |
| 7,829,947 B2 | 11/2010 | Hebert | |
| 7,851,856 B2 | 12/2010 | Hebert | |
| 7,867,852 B2 | 1/2011 | Hebert | |
| 7,875,541 B2 | 1/2011 | Tai | |
| 7,879,676 B2 | 2/2011 | Lee | |
| 7,952,139 B2 | 5/2011 | Bhalla et al. | |
| 8,106,446 B2 | 1/2012 | Montgomery | |
| 8,193,581 B2 | 6/2012 | Yedinak et al. | |
| 8,252,648 B2 | 8/2012 | Lee et al. | |
| 8,324,683 B2 | 12/2012 | Lui et al. | |
| 8,367,501 B2 | 2/2013 | Lui et al. | |
| 8,394,702 B2 | 3/2013 | Tai et al. | |
| 8,431,457 B2 * | 4/2013 | Chang | H01L 29/402 257/330 |
| 8,431,470 B2 | 4/2013 | Lui et al. | |
| 8,476,676 B2 | 7/2013 | Chang et al. | |
| 8,502,302 B2 * | 8/2013 | Su | H01L 29/872 257/328 |
| 8,519,476 B2 | 8/2013 | Chen et al. | |
| 8,580,667 B2 | 11/2013 | Lui et al. | |
| 8,587,061 B2 | 11/2013 | Lee et al. | |
| 8,637,926 B2 | 1/2014 | Lui et al. | |
| 8,772,828 B2 | 7/2014 | Chang et al. | |
| 8,785,270 B2 * | 7/2014 | Su | H01L 29/872 257/E21.41 |
| 8,828,857 B2 | 9/2014 | Lui et al. | |
| 2003/0085422 A1 | 5/2003 | Amali et al. | |
| 2008/0265289 A1 | 10/2008 | Bhalla | |
| 2008/0265312 A1 | 10/2008 | Bhalla et al. | |
| 2009/0020810 A1 | 1/2009 | Marchant | |
| 2009/0111227 A1 | 4/2009 | Kocon et al. | |
| 2009/0114949 A1 | 5/2009 | Hebert | |
| 2009/0127593 A1 | 5/2009 | Bhalla | |
| 2009/0181503 A1 | 7/2009 | Bhalla | |
| 2009/0224316 A1 | 9/2009 | Bhalla | |
| 2009/0230465 A1 | 9/2009 | Yilmaz et al. | |
| 2009/0242973 A1 | 10/2009 | Hebert et al. | |
| 2009/0315107 A1 | 12/2009 | Hsieh | |
| 2010/0090276 A1 | 4/2010 | Bhalla et al. | |
| 2010/0140697 A1 | 6/2010 | Yedinak et al. | |
| 2010/0148246 A1 | 6/2010 | Bhalla | |
| 2010/0155876 A1 | 6/2010 | Pan | |
| 2010/0225296 A1 | 9/2010 | Chang et al. | |
| 2010/0258897 A1 | 10/2010 | Lui | |
| 2010/0314693 A1 | 12/2010 | Su et al. | |
| 2010/0320461 A1 | 12/2010 | Su | |
| 2010/0330767 A1 | 12/2010 | Lui | |
| 2011/0014766 A1 | 1/2011 | Hebert | |
| 2011/0037120 A1 | 2/2011 | Chen et al. | |
| 2011/0039383 A1 | 2/2011 | Chen et al. | |
| 2011/0042724 A1 | 2/2011 | Bhalla | |
| 2011/0042727 A1 | 2/2011 | Pan et al. | |
| 2011/0049564 A1 | 3/2011 | Guan | |
| 2011/0049618 A1 | 3/2011 | Lee et al. | |
| 2011/0068386 A1 | 3/2011 | Tai et al. | |
| 2011/0068395 A1 | 3/2011 | Hebert | |
| 2011/0073906 A1 | 3/2011 | Bobde | |
| 2011/0073943 A1 | 3/2011 | Hebert | |
| 2011/0076815 A1 | 3/2011 | Bhalla | |
| 2011/0095361 A1 | 4/2011 | Chang et al. | |
| 2011/0101446 A1 | 5/2011 | Guan et al. | |
| 2011/0140194 A1 | 6/2011 | Bhalla et al. | |
| 2013/0175612 A1 | 7/2013 | Tai et al. | |
| 2013/0228860 A1 | 9/2013 | Chang et al. | |
| 2013/0341689 A1 | 12/2013 | Chen et al. | |
| 2014/0048846 A1 | 2/2014 | Lui et al. | |
| 2014/0138767 A1 | 5/2014 | Lui et al. | |

OTHER PUBLICATIONS

Non-Final Office Action for U.S. Appl. No. 13/948,988, dated Dec. 9, 2013.

Chien, Feng-Tso; Chien-Nan Liao; Yao-Tsung Tsai, "A novel high channel density trench power MOSFETs design by asymmetric wing-cell structure," 2007 European Conference on Power Electronics and Applications, pp. 1-7, Sep. 2-5, 2007.

* cited by examiner

INTEGRATING SCHOTTKY DIODE INTO POWER MOSFET

PRIORITY CLAIM

This Application is a continuation of U.S. patent application Ser. No. 13/948,988, filed Jul. 23, 2013, to Yi Su et al. entitled "INTEGRATING SCHOTTKY DIODE INTO POWER MOSFET", now U.S. Pat. No. 8,785,270 issued Jul. 22, 2014, the entire disclosures of which are incorporated by reference herein.

U.S. patent application Ser. No. 13/948,988 is a divisional of U.S. patent application Ser. No. 13/098,852, filed May 2, 2011, to Yi Su et al. entitled "INTEGRATING SCHOTTKY DIODE INTO POWER MOSFET", now U.S. Pat. No. 8,502,302 issued Aug. 6, 2013, the entire disclosures of which are incorporated by reference herein.

FIELD OF THE INVENTION

This invention generally relates to semiconductor devices and more particularly to the methods for fabricating shielded gate trench MOS with an integrated Schottky diode within the termination region.

BACKGROUND OF INVENTION

A method for fabricating a semiconductor device using only four masks is disclosed in U.S. patent application Ser. No. 12/722,384 filed Mar. 11, 2010, entitled "SHIELDED GATE TRENCH MOS WITH IMPROVED SOURCE PICKUP LAYOUT", the entire contents of which are incorporated herein by reference. The method includes forming a plurality of trenches by applying a first mask, forming a first conductive region in the plurality of trenches, forming an intermediate dielectric region and a termination protection region by applying a second mask, forming a second conductive region in at least some of the trenches, forming a first electrical contact to the second conductive regions and forming a second electrical contact to the first conductive region by applying a third mask, disposing a metal layer, and forming a source metal region and a gate metal region by applying a fourth mask.

This integrated structure involves power MOSFET devices that implement a body diode. However, typical P-N junction diodes exhibit undesirable characteristics during operation. These undesirable characteristics include: large forward conduction loss, storage of charge between body-epitaxial junction when operating in forward bias, excess stored minority charges which cause large recovery currents and voltage overshoots when the power MOSFET is switched from forward bias to reverse bias, and phase node voltage overshooting/ringing when implemented in a DC-DC converter application.

Schottky diodes, on the other hand, exhibit several desirable characteristics which make it preferable over P-N junction diodes, particularly in power MOSFET configurations. The low forward drop of the Schottky diode during forward conduction reduces power dissipation of the device and leads to lower conduction loss. The conduction of the Schottky is carried out by majority carriers, so minority carrier charge storage effects do not occur during switching of the device.

It is within this context that embodiments of the present invention arise.

DESCRIPTION OF SPECIFIC EMBODIMENTS

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications, and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Embodiments of the integrated structure comprising power MOSFET devices implementing Schottky diodes and their fabrication process are disclosed. Even with the addition of Schottky diodes into the integrated structure, the fabrication process continues to employ a self aligned contact scheme and still requires only four masks. The resulting integrated structures are less expensive to produce and have improved device characteristics.

Figure 1A:
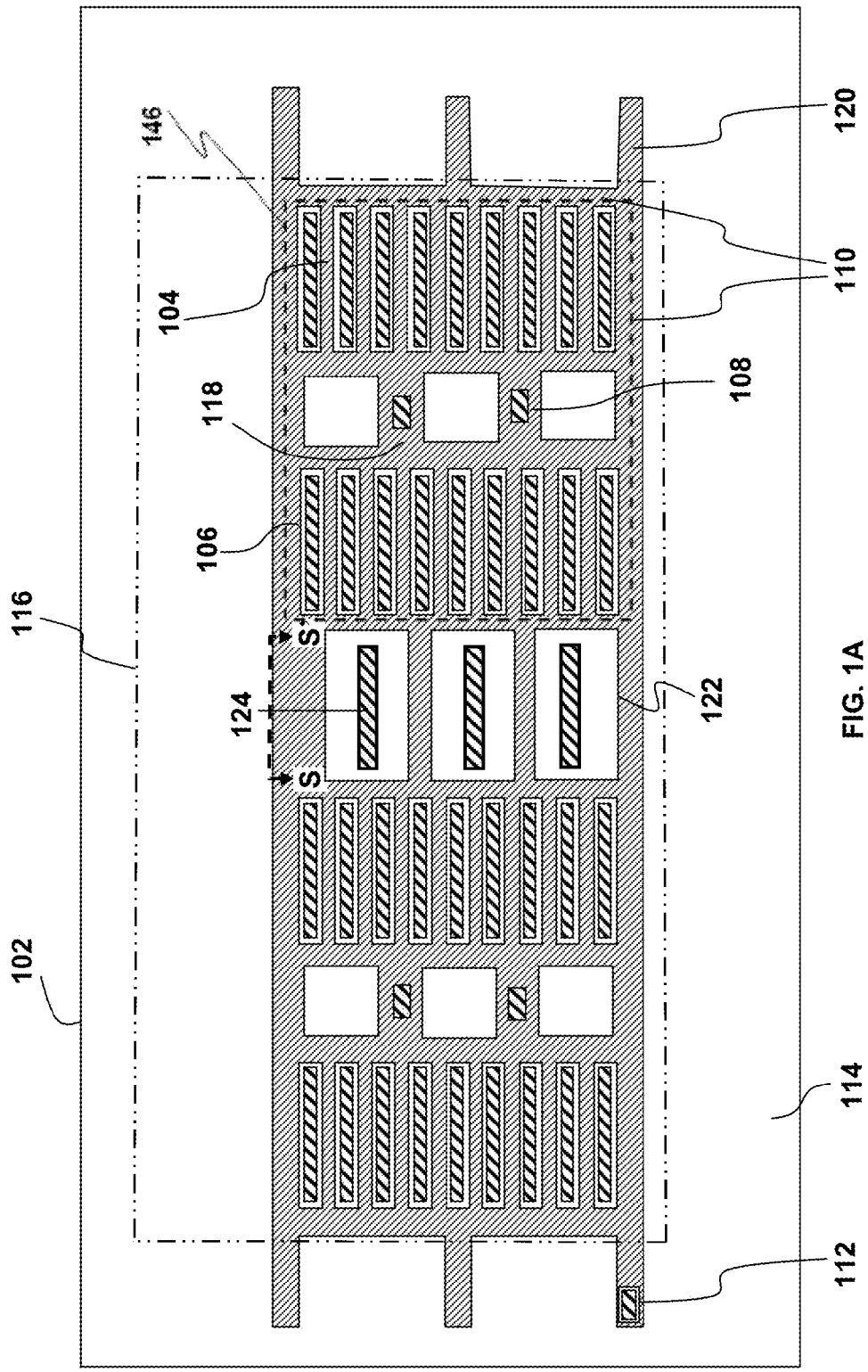
FIG. 1A is a diagram illustrating a top view of an integrated structure according to an embodiment of the present invention.

FIG. 1A is a diagram illustrating a top view of an integrated structure according to an embodiment of our present invention. In this example, the integrated structure 100 is built on a semiconductor substrate 102. Active regions 146 of the structure include active gate trenches such as 104, in which gates are formed. The active regions 146 further include source/body contact openings such as 106, in which contacts are formed to electrically connect source regions and body regions to the source metal 116. The active regions 146 also include shield contacts such as 108, which may be made of a conductive material, such as polysilicon (poly). In a shield pickup contact 108, a shield electrode is disposed in a shield pickup trench 118 and is electrically connected through a shield pickup contact opening 108 to source metal 116, which in turn is electrically connected to the source and body regions of the device. The active regions are surrounded by trenches such as 110, which serve several purposes, including as termination trenches that separate high potential areas (such as the drain) from low potential areas (such as the source), and as gate runners configured to form electrical connections with the gate electrodes in active gate trenches. The region surrounding, and in between, the active regions 146 may be called the termination area 147. Termination/gate runner trenches 110 further include portions that form gate runner extension trenches 120. The gate runner extension trenches extend into gate metal area 114 and serve as gate pickup trenches where gate pickup contact openings 112 are disposed for electrically connecting gate runner to gate metal 114.

The features described above duplicate those of the integrated structure in U.S. patent application Ser. No. 12/722,384. The invented method incorporates additional features. A mesa 122 is formed between two termination trenches, and one or more Schottky diode contacts 124 are formed within the mesa 122. The addition of these Schottky diodes provides the power MOSFET devices with the desirable characteristics discussed above.

Figure 1B:
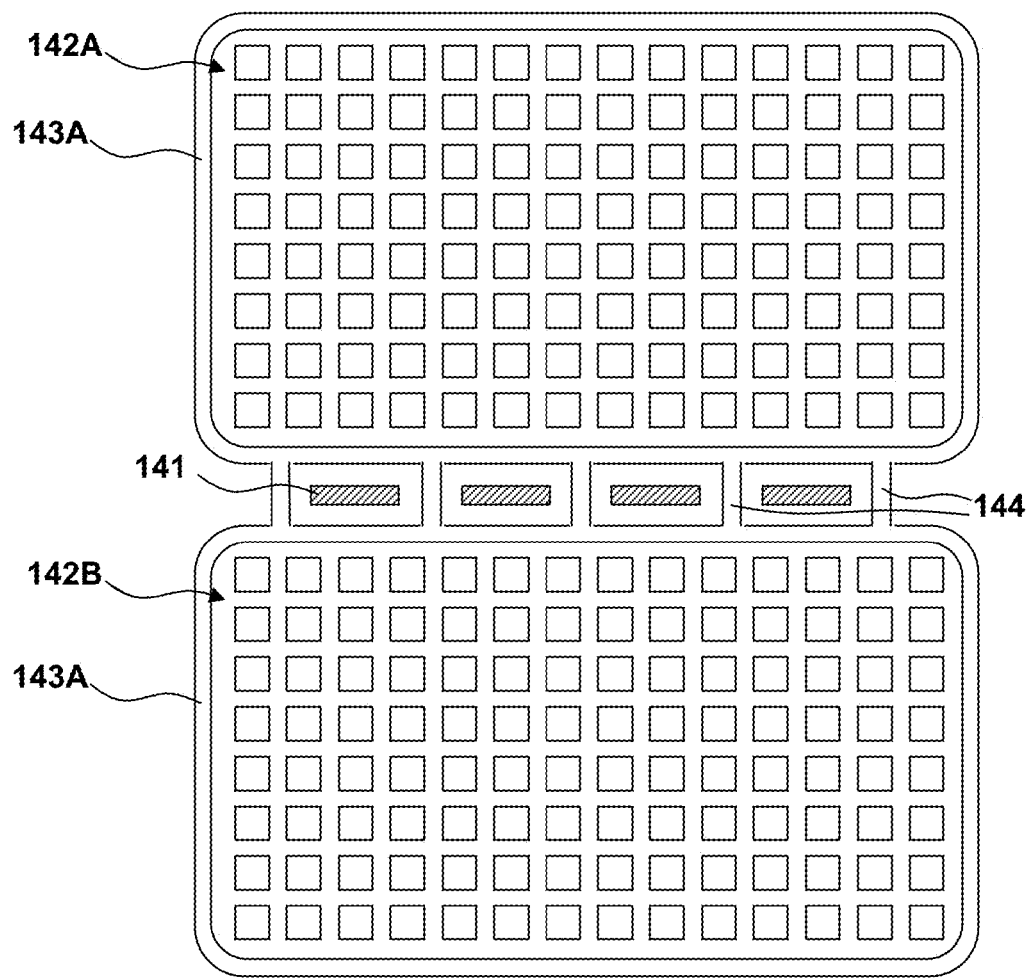
FIG. 1B is a diagram illustrating a top view of an integrated structure in which Schottky diodes are arranged in a closed-cell layout according to an embodiment of the present invention.

In certain embodiments of the present invention it is desirable locate a Schottky diode or group of diodes between adjacent active device cells or groups of such cells. There are a number of different possible layouts for locating the Schottky diode(s) between active cells. By way of example, and not by way of limitation, FIG. 1B illustrates a first possible Schottky layout referred to herein as a "closed cell" Schottky layout. In this type of layout, Schottky diode regions 141 are located between first and second groups of active device cells 142A, 142B. Each group of active cells 142A, 142B is surrounded by a corresponding termination structure 143A, 143B. The Schottky diode structures 141 are formed in a space between the termination structures of the first and second groups of active cells. Each Schottky diode structure includes a vertical connection to a source metal layer (not shown). The Schottky diode structures 141 are arranged as a series of Schottky cells that run in a line parallel to the nearby termination structures 143A, 143B. The termination structures for the two adjacent active cell groups are connected by transverse termination structures 144 that run perpendicular to the diode structures 141. Each Schottky diode cell structure is therefore surrounded by termination structure.

Figure 1C:
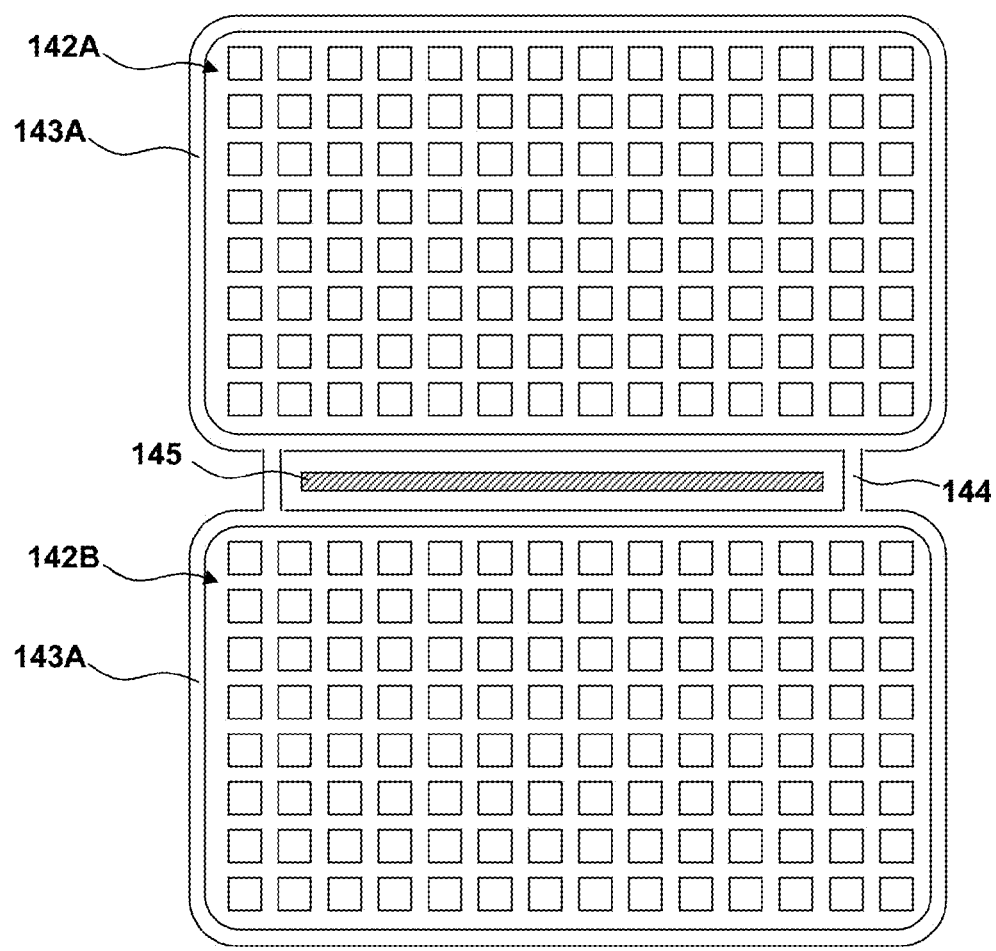
FIG. 1C is a diagram illustrating a top view of an integrated structure in which Schottky diodes are arranged in a stripe cell layout according to an embodiment of the present invention.

FIG. 1C illustrates an alternative possible Schottky layout referred to herein as a "stripe cell" Schottky layout. In this layout, a striped Schottky diode region 145 is located between first and second groups of active device cells 142A, 142B surrounded by a corresponding termination structure 143A, 143B. The striped Schottky diode structure 145 runs in a line parallel to the nearby termination structures 143A, 143B. The termination structures for the two adjacent active cell groups are connected by transverse termination structures 144 that run perpendicular to the diode structures 141 near each end of the Schottky diode structure 144. The Schottky diode structure 144 is therefore contiguous and surrounded by termination structure.

Figure 1D:
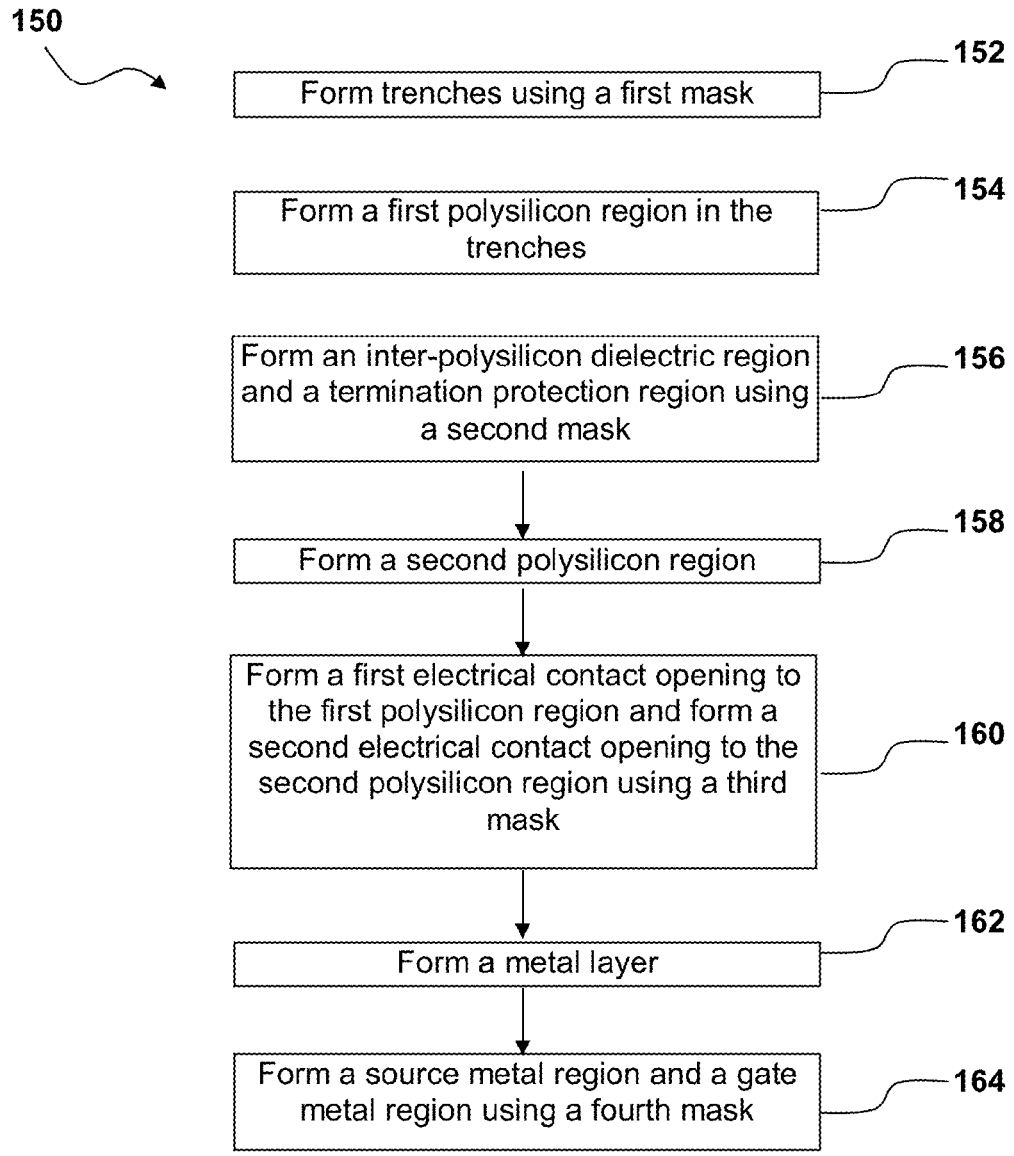
FIG. 1D is a flow diagram illustrating a process for fabricating an integrated structure of the type depicted in FIG. 1A.

FIG. 1D is a flowchart illustrating an embodiment of a process for fabricating an integrated structure such as 100. Process 150 involves four masks. At 152, a number of trenches are formed using a first mask. At 154, a first set of polysilicon regions are formed in the plurality of trenches. At 156, one or more inter-polysilicon dielectric regions and one or more termination protection regions are formed using a second mask. At 158, polysilicon is deposited in some of the trenches to form a second set of polysilicon regions. At 160, using a third mask, first electrical contact opening is made to a gate poly, a second electrical contact opening is made to a source poly, and one or more Schottky diodes are formed within the mesa formed between termination trenches in an area outside an active area containing the active gate trenches. At 162, a metal layer is disposed. At 164, a source metal region and a gate metal region are formed using a fourth mask.

Fabrication process 150 is discussed in greater detail below. However, for purposes of simplicity, the discussion will be limited to the formation of Schottky diodes within the integrated structure. FIGS. 2-5 illustrate top views of four masks used in the processes and FIGS. 6SS'-36SS' illustrate cross-sectional views along SS'. SS' extends across a Schottky diode, two termination trenches configured to terminate and surround an active region, and the edge of two source/body contacts in the active region.

Figure 6S:
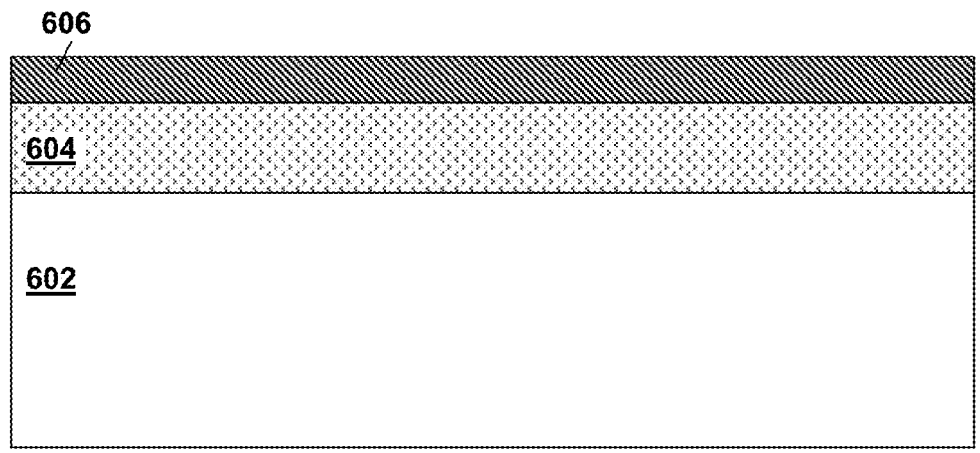
FIG. 6SS'-34SS' are cross sectional diagrams illustrating the steps of fabrication of the integrated structure of the type depicted in FIG. 1A along a line SS'.

In the following discussion, an N type device is described for purposes of illustration. P type devices may be fabricated using a similar process. In FIG. 6SS', an N type substrate 602 (i.e., an N' silicon wafer with an N⁻ epi layer grown on it) is used as the drain of the device. In some embodiments, Epi doping concentration is $2 \times 10^{16}$ dopants/cm$^3$, with a thickness of 1.4 µm. In other embodiments, for a heavily doped N++ substrate, a dual epi layer is used, which includes an epi layer with Epi doping concentration of $2 \times 10^{16}$ dopants/cm$^3$ and a thickness of 1.4 µm and a buffer layer with Epi doping concentration of $10^{17}$ dopants/cm$^3$ and a thickness of 2.4 µm.

A silicon oxide layer 604 is formed on the substrate 602 by deposition or thermal oxidation. A nitride layer 606 is disposed on top of the silicon oxide layer. In some embodiments, the thickness of the silicon oxide layer is approximately 500 to 1500 Å and the thickness of the nitride layer is approximately 1500 Å. A thick oxide layer is desirable to shield the Schottky region from subsequent body/source doping during the fabrication process.

Figure 2:
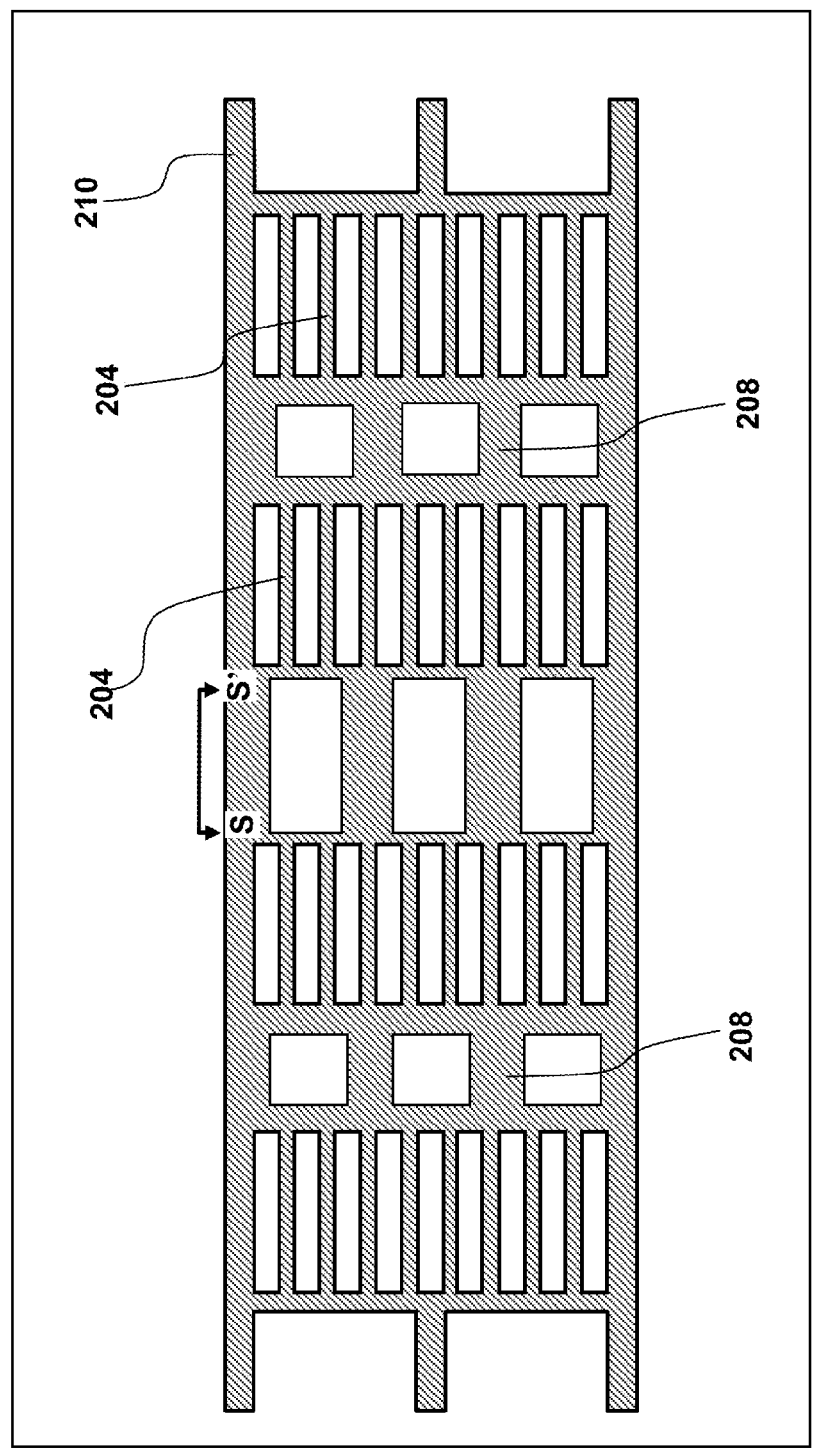
FIG. 2 is a diagram illustrating an example of a first mask used in the fabrication process for fabricating an integrated structure of the type depicted in FIG. 1A.

A photo resist (PR) layer is then applied on top of the nitride layer and patterned using a first mask. FIG. 2 is a diagram illustrating the top view of an example of a first mask, also referred to as the trench mask. The trench mask includes openings to allow for exposure of the device trenches and termination trenches to an etch process. Trench mask 200 is used to pattern the PR layer. The PR areas corresponding to the shaded areas of the mask are not exposed, and the PR areas corresponding to the un-shaded areas of the mask are exposed. In the following discussion, for purposes of illustration, it is assumed that positive PR is used, thus the unexposed areas are kept and the exposed areas are removed. Negative PR may also be used, and the mask would be modified accordingly. The trench mask 200 defines active gate trenches 204, source poly pickup trenches such as 208, and gate runner/termination trenches 210. In some embodiments, the widths of the active gate trenches, the source poly pickup trenches, and the gate runner/termination trenches are approximately 0.45 µm, 1.0 µm, and 2.0 µm, respectively. Low grade masks such as masks with critical dimension of 0.35 µm can be used to fabricate the device thereby reducing the cost of masks required.

Figure 7S:
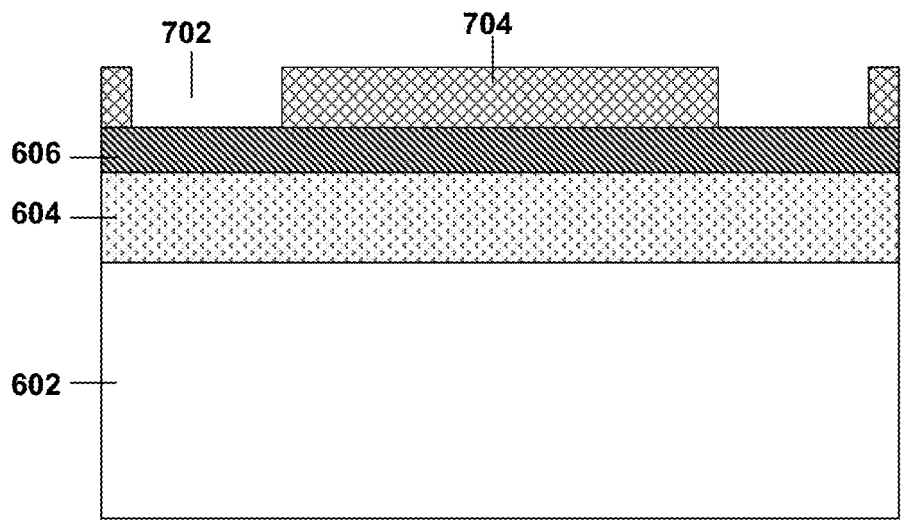

In FIG. 7SS', the residual PR layer 704 forms termination trench openings 702.

Figure 8S:
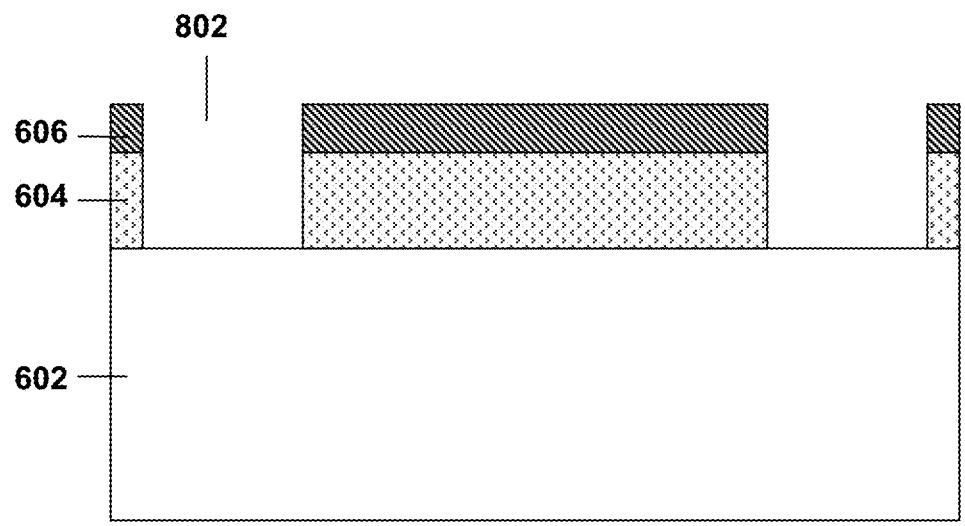

Next, a hard mask (HM) etch is performed to etch away exposed portions of the nitride layer and silicon oxide layer. The etching stops at the silicon surface. The remaining PR is then removed. In FIG. 8SS', trench openings 802 are formed in exposed areas.

Figure 9S:
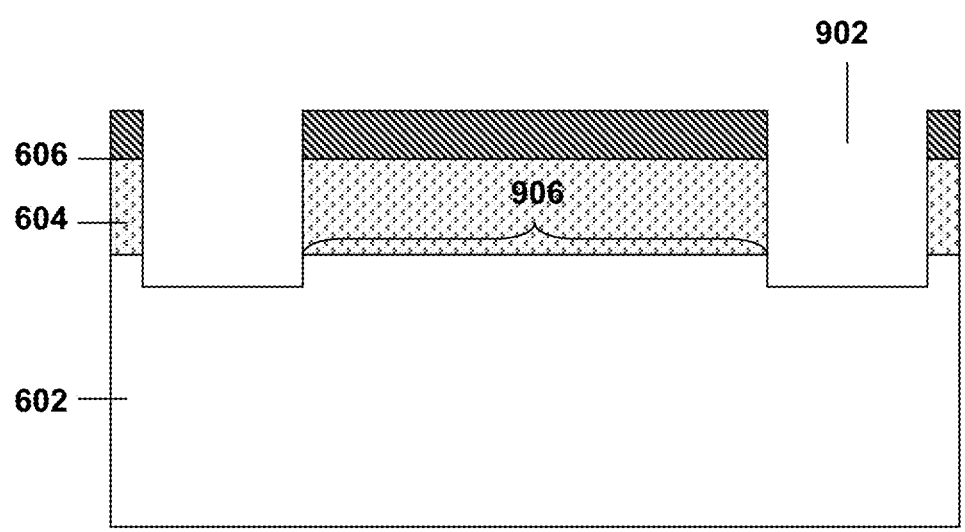

A trench etch follows the HM etch. In FIG. 9SS', the termination trench opening 902 are etched deeper. In some embodiments, the target depth of the trenches is approximately 0.3 µm to 0.5 µm. The area between the termination trench openings 902 forms a mesa 906 wherein the Schottky diode is formed. For a closed cell Schottky layout design having stripe cells with a cell pitch of 1 µm in the main die, the Schottky mesa 906 is wider than the active device mesa on which the active devices are formed because a wider Schottky mesa 906 supports a higher breakdown voltage. However, when the width of the Schottky mesa 906 becomes too great, a high breakdown voltage is no longer supported. By way of example, and not by way of limitation, a Schottky mesa width of about 1.2 µm to 1.4 µm may support a 30 volt device. For a stripe cell Schottky layout design in a 1 µm pitch stripe cell main die, the Schottky mesa width should be about 0.6 µm to about 0.8 µm. When the Schottky mesa width is narrower than 0.6 µm or wider than 0.8 µm, the breakdown voltage will drop. The Schottky mesa width depends on the epi doping concentration of the substrate. The Schottky mesa width relative to the active device mesa width is a function of the epi doping concentration of the substrate, e.g., a doping concentration of an epitaxial layer grown on the substrate.

Figure 10S:
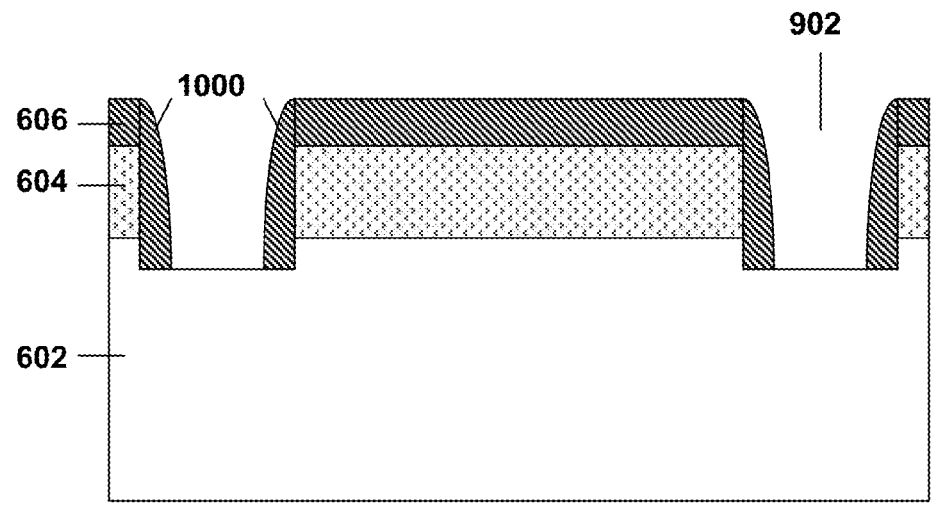

A thin layer of oxide is deposited or grown thermally in the trench openings 902, lining both the trench bottom and the trench walls (not illustrated). The oxide layer is approximately 200 Å thick in some embodiments. Once the oxide is formed, an additional layer of nitride is deposited and etched back along the horizontal surface. In some embodiments, the thickness of the nitride layer is approximately 2200 Å. Nitride spacers 1000 are formed along the trench walls after blanket etch back, as shown in FIG. 10SS'.

Figure 11S:
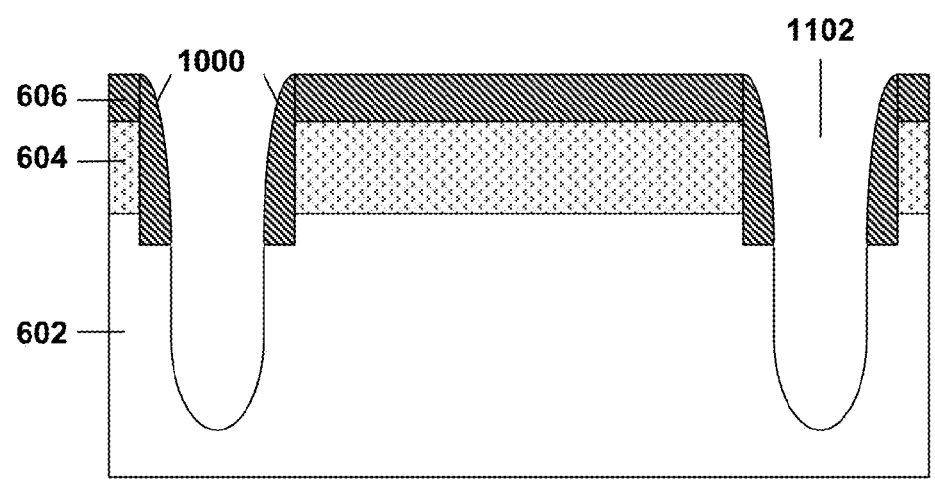

Next, any exposed liner oxide layer in the bottom of the trench opening is removed and a blanket silicon etch is performed to further deepen the termination trenches 1102 in FIG. 11SS'. The resulting trench depth is on the order of approximately 1.5 µm to 2.5 µm, and the trench walls are sloped at an angle of approximately 87°~88°. The nitride spacers 1000 allow for a self-aligned etching step that does not require additional alignment steps such as an additional alignment mask, thus achieving trench slope etch. A wider trench opening results in a deeper trench than a narrower trench opening due to the nature of the Silicon etch loading factor. The depth of the termination trenches 1102 may range from about 1 micron to about 2.5 microns. Round hole (R/H) etch ranging from about 250 Å to about 500 Å is performed to make the corners of the trenches smoother to prevent high electric fields due to sharp corners.

Figure 12S:
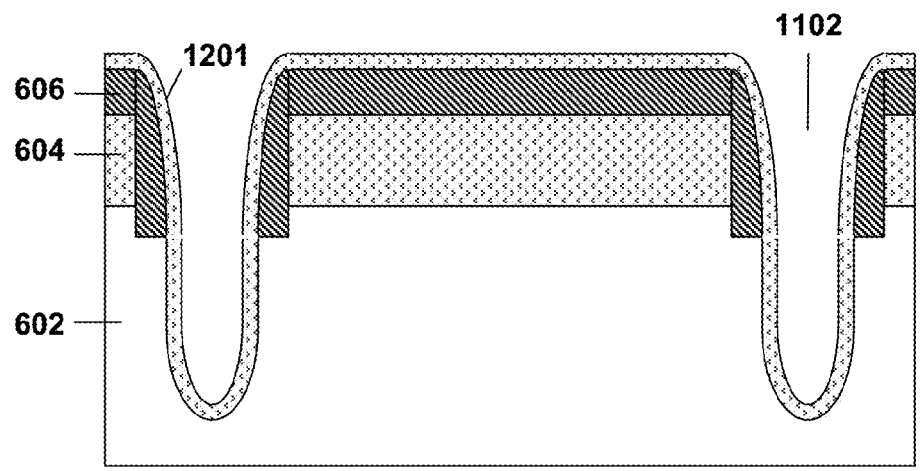

In FIG. 12SS', one or more oxide layers 1201 are deposited or thermally grown. In some embodiments, a sacrificial oxide layer of approximately 500 Å is optionally grown and removed to improve the silicon surface. A layer of oxide of approximately 250 Å is grown, followed by a layer of high temperature deposition oxide (HTO) or thermal oxide of approximately 900 Å.

Figure 13S:
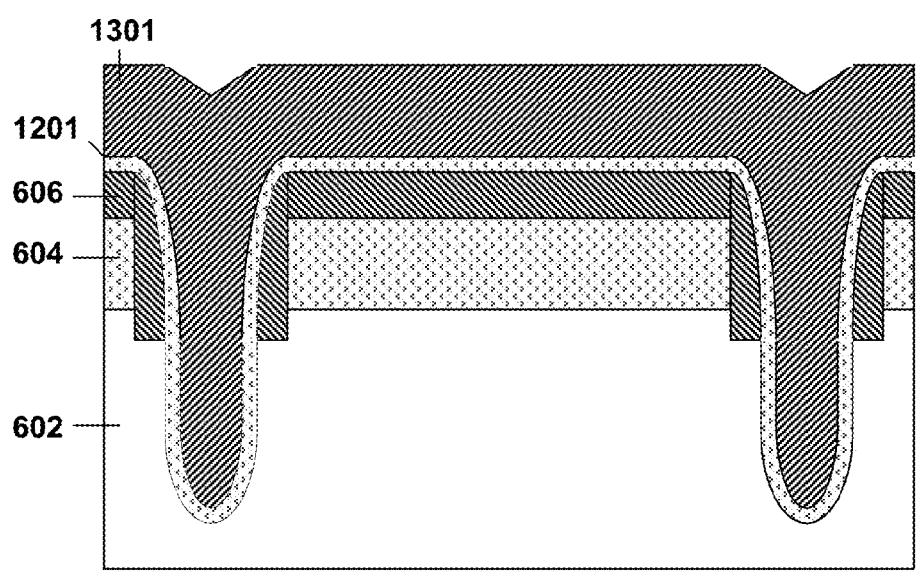

Polysilicon (poly) 1301 is disposed, as shown in FIG. 13SS'. In some embodiments, the thickness of the poly is approximately 12000 Å, which is greater than half the width of the widest trench. Thus, poly layers on the sidewalls merge and completely fill all the trenches. This layer of poly is sometimes referred to as source poly, shield poly, or poly 1.

Figure 14S:
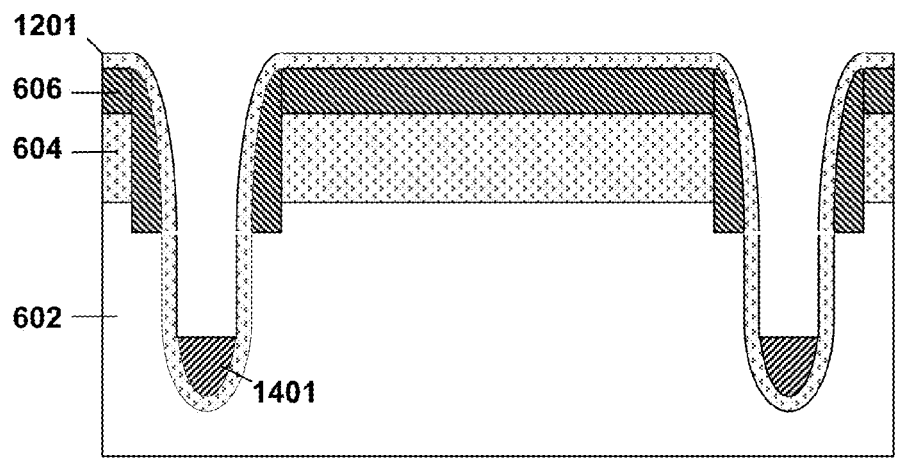

The source poly is then etched back using dry etch, as illustrated in FIG. 14SS'. In this example, in the termination trenches, the remaining poly 1401 has a thickness of approximately 6000 Å.

Figure 15S:
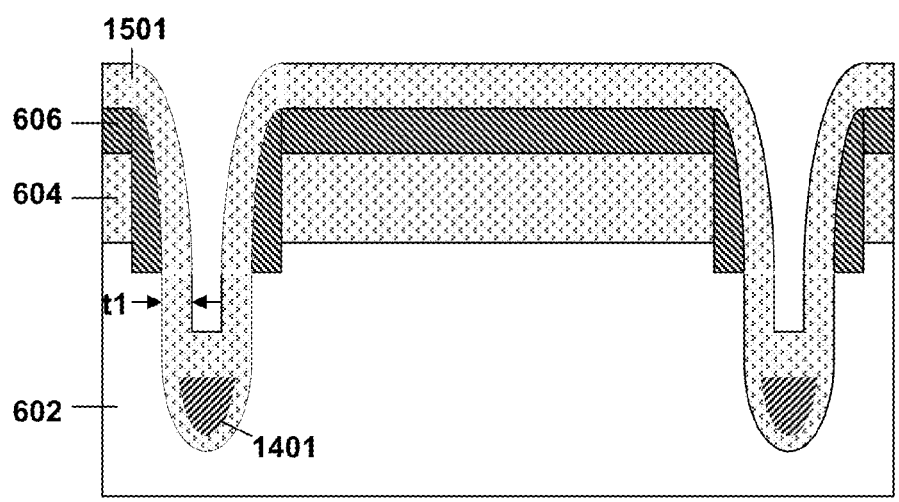

High density plasma (HDP) oxide 1501 is then deposited and densified. In some embodiments, the densification takes place at a temperature of approximately 1150° C. and lasts for approximately 30 seconds. The oxide on the trench sidewalls has a substantially uniform thickness (labeled as t1 in FIG. 15SS') throughout the device. In some embodiments, t1 is approximately ranging from about 2000 Å to about 4000 Å to partially fill the wider trenches (such as termination trenches). Thus, the wider trenches are not completely filled, allowing a gate electrode to be disposed in the space not completely filled by the HDP 1501 oxide in such wider trenches in a later step.

Figure 16S:
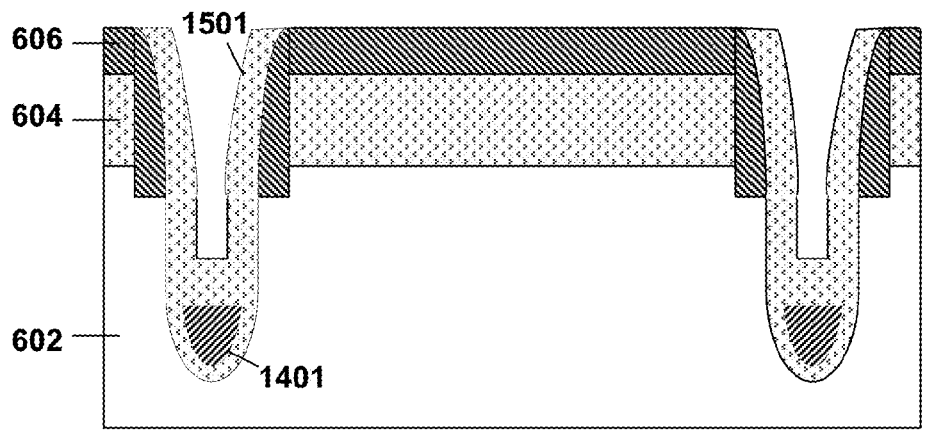

Oxide chemical mechanical polish (CMP) is then performed. As illustrated in FIG. 16SS', the CMP process is used to polish the HDP oxide 1501 until the top surface of the oxide is even with the nitride surface 606, which serves as an etch stop.

Figure 17S:
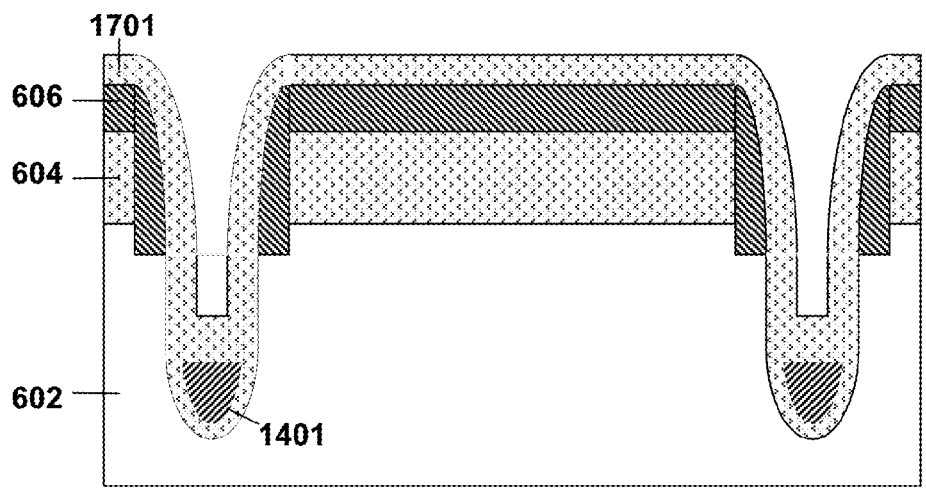

FIG. 17SS' illustrates the deposition of an additional oxide layer 1701. The thickness of the additional oxide layer 1701 is approximately 1000 Å to 2000 Å in some embodiments. The thickness of this additional oxide layer 1701 controls the degree of undercut during a wet etch to be subsequently performed under a second mask. The oxide film 1701 also protects the nitride 606 in non-active areas of the device. The protected nitride 606 allows maskless blanket etching of the Silicon substrate in a later process step.

Figure 3:
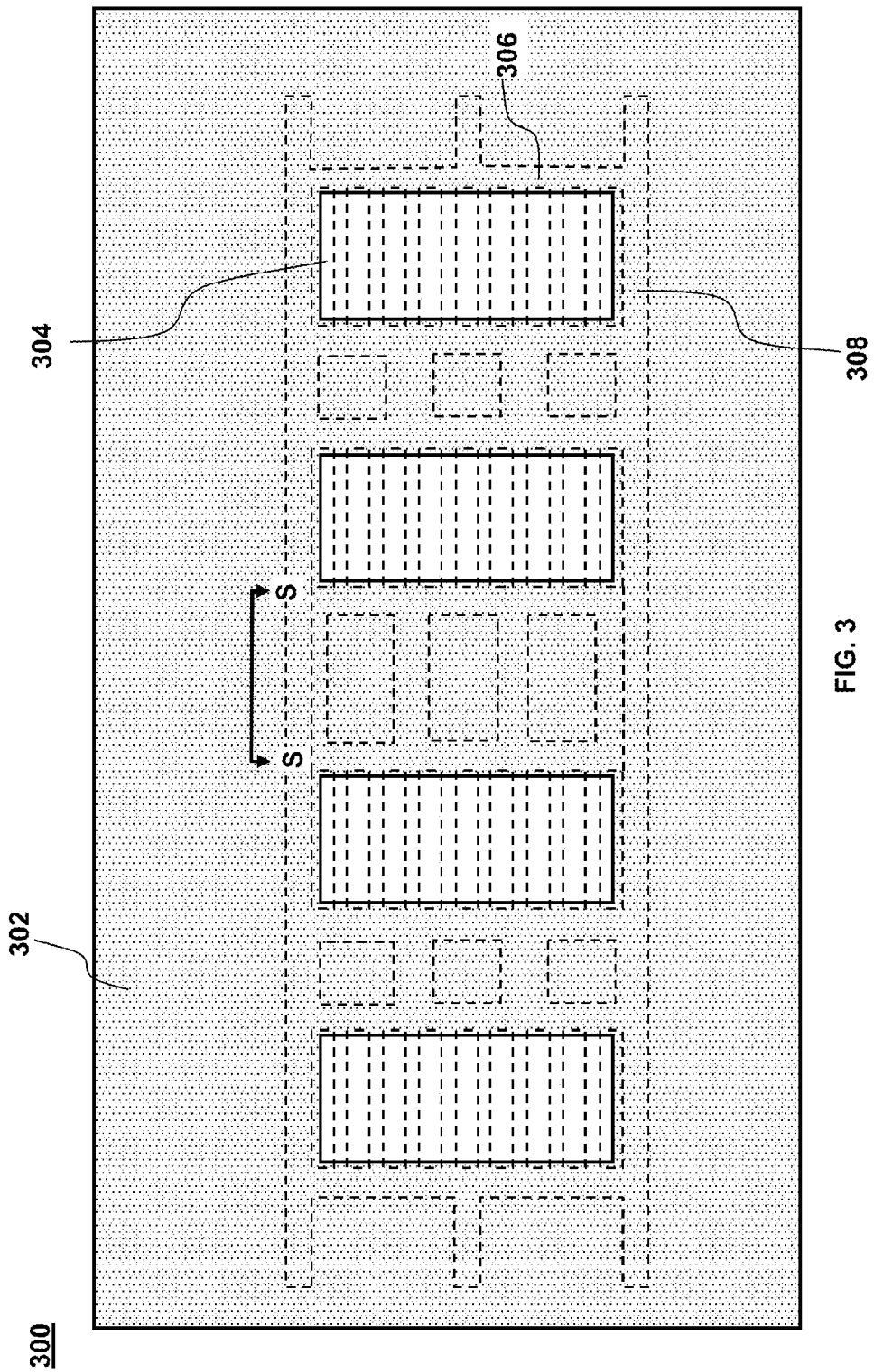
FIG. 3 is a diagram illustrating an example of a second mask used in the fabrication process for fabricating an integrated structure of the type depicted in FIG. 1A.

A layer of photo resist is then spun on the surface of the structure and a second mask is applied. FIG. 3 is a diagram illustrating the top view of an example of a second mask 300. The outline of the previous mask, the trench mask, is shown in dashed lines. The outline of the second mask 300, also referred to as the poly cover mask, is shown in dashed lines. The poly cover mask 300 is used to facilitate the formation of the inter-polysilicon region and the termination protection region. PR in area 302 (shaded area) of the poly cover mask 300 is not exposed and kept, thus covering areas underneath and protecting the areas from oxide wet etching. PR in areas such as 304 (un-shaded areas) of the mask 300 are exposed and removed. Areas not covered by PR are etched. The active MOSFET cells are formed within openings such as 304. As will be described in greater detail below, the edges of the openings are placed close to termination trenches such as 306 and 308 to facilitate asymmetric etching of these trenches.

Figure 18S:
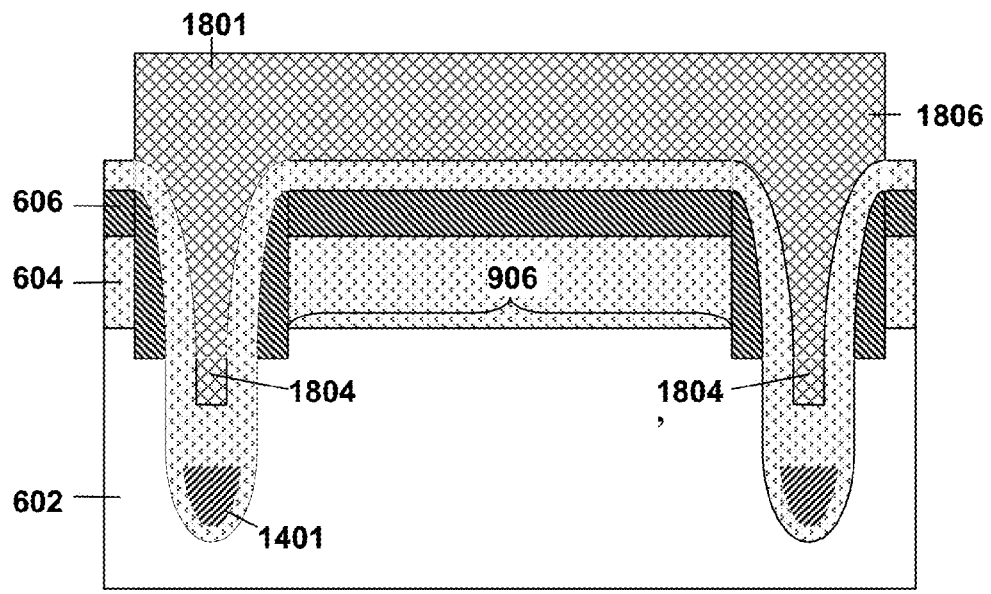

FIG. 18SS' illustrates the pattern of the PR cover after the exposed portions have been removed. The PR 1801 covers the entire Schottky mesa 906, fills termination trenches at 1804, 1804', and extends over into the active area at 1806. As will be shown in connection with FIG. 19SS' below, a portion of the oxide under the PR 1801 will be removed by etching. Mask overlap and wet or dry etch undercut together determine the final profile. Thus, the distance of the PR cover 1801 extending into the active region in part determines how much oxide will be removed by etching. The oxide undercut depth ranges from about 0.6 µm to about 1.5 µm. The PR cover 1801 also shields the oxide formed at the Schottky mesa 906 from being etched.

Figure 19S:
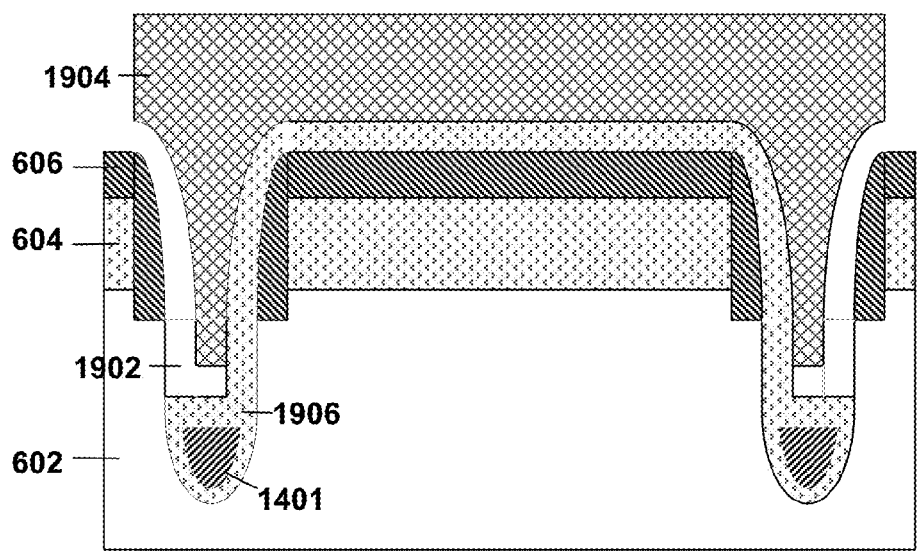

Wet or dry etch is then performed. The results are shown in FIG. 19SS'. Some oxide in areas unmasked by PR 1801 is removed, such that the remaining oxide is held at desired height. Some oxide near the edges of the PR is also removed. In FIG. 19SS', a portion of oxide in termination trench 1902, located underneath the PR and close to the PR edge is removed. The amount of oxide that is etched can be controlled by adjusting the position of edge 1904 of PR layer. Extending the edge 1904 closer to the active region would result in less oxide being etched, and extending the edge further away from the active region would have the opposite effect. The amount of oxide etched away can vary in different embodiments. In the example shown, enough oxide is etched away such that the remaining oxide lining the trench wall in the vertical direction is approximately uniform in thickness. The oxide layer 1906 above the poly 1401 is referred to as inter-poly dielectric (IPD), which can range between a few hundred to a few thousand angstroms.

Figure 20S:
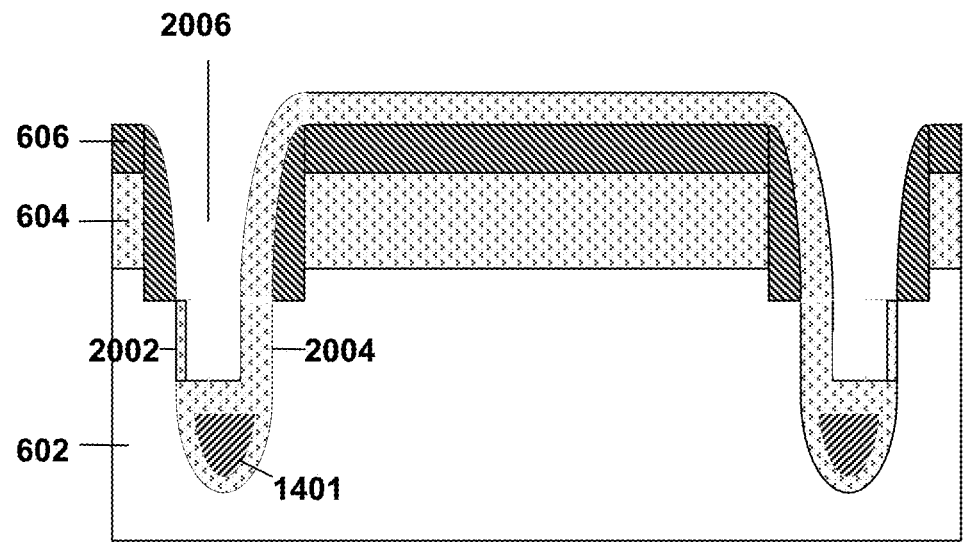

The PR is then removed, and a layer of gate oxide is disposed or thermally grown. In some embodiments, the added oxide layer is approximately 450 Å thick in some embodiments. Thus, in FIG. 20SS', trench walls 2002, 2004 are lined with oxide. Termination trench 2006 has asymmetric sidewalls, where sidewall 2004 has a thicker oxide layer than sidewall 2002.

Figure 21S:
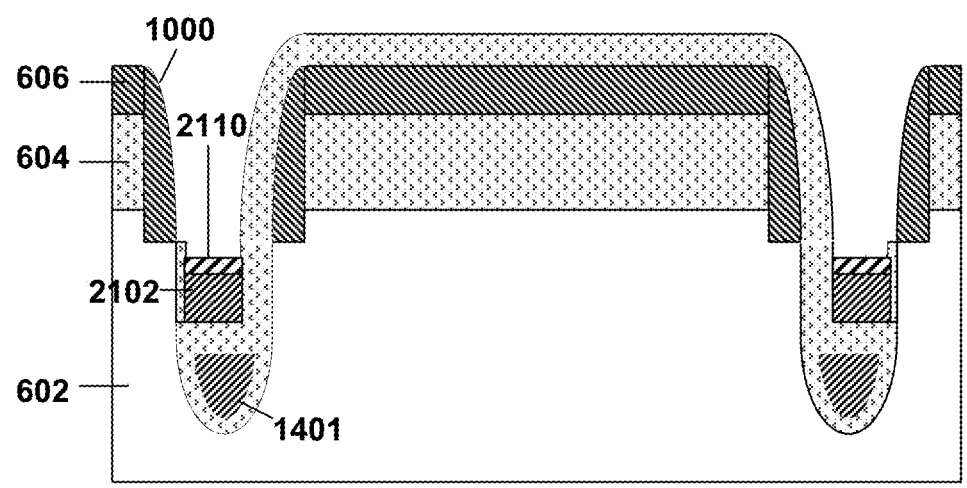

Another poly deposition and etch back is performed. In FIG. 21SS', approximately 8000 Å to 12000 Å of poly is disposed in various trenches. The disposed poly is etched back, forming gate poly 2102. In the example shown, the poly surface is approximately 500 Å to 1000 Å below the nitride spacer 1000 bottom reference level. A layer of metal such as titanium or cobalt is deposited and annealed. Where the metal is in contact with the poly, a polycide layer 2110 is formed. The titanium or cobalt metal over the oxide or nitride does not form silicide and is removed.

Figure 22S:
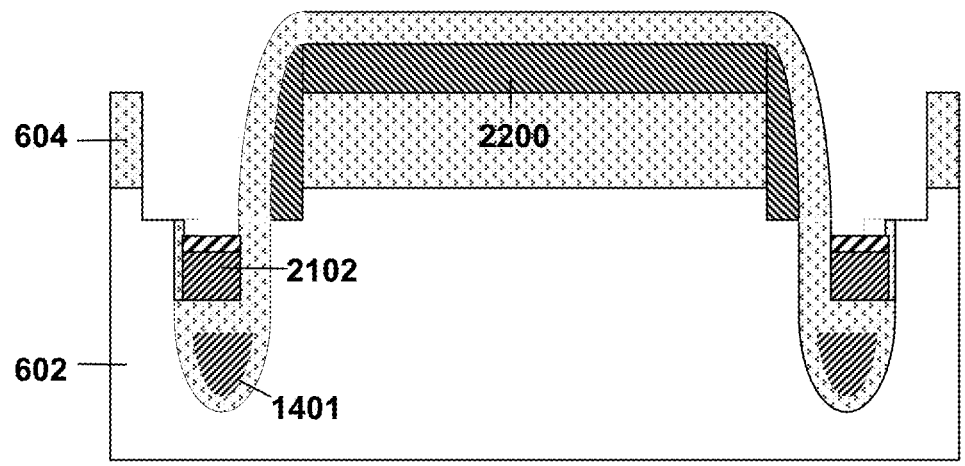

In FIG. 22SS', exposed nitride spacers in the termination trench are removed through a wet etch process. However, the nitride 2200 positioned on the Schottky mesa is shielded from the wet etch.

Figure 23S:
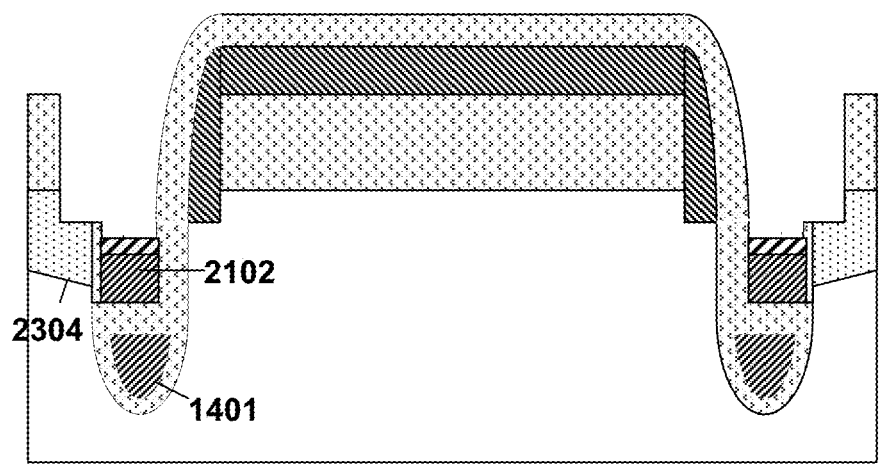

In FIG. 23SS', body implant takes place. The device is bombarded with dopant ions at an angle. In active areas unprotected by nitride, the implant forms body regions such as 2304. In some embodiments, Boron ions with a dosage level of approximately $10^{13}/cm^3$ at an implantation energy from about 60 KeV to about 180 KeV are used to form an N-channel device. Other types of ions can also be used. For example, phosphorous ions may be used for P-channel devices.

Figure 24S:
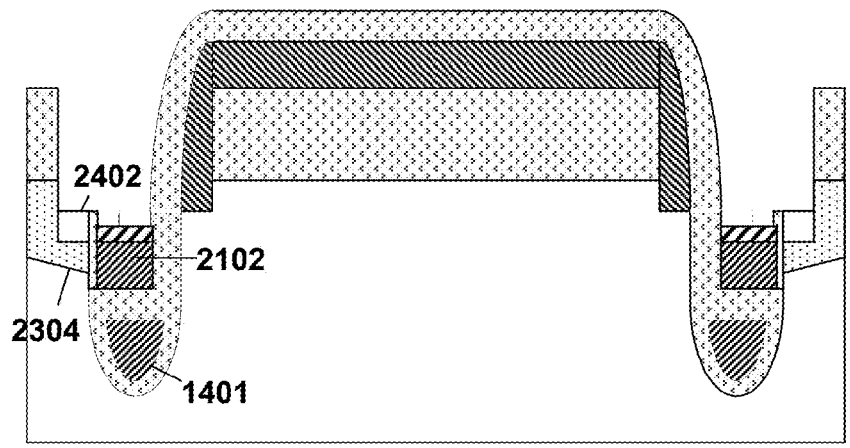

In FIG. 24SS', source implant takes place with a zero tilt angle. The device is again bombarded with dopant ions. In some embodiments, Arsenic ions with a dosage level of $4 \times 10^{15}$ at an implantation energy from about 40 KeV to about 80 KeV are used. Source regions such as 2402 are formed within body regions such as 2304.

No additional mask is required to implant the body and the source of the device. At the Schottky mesa, the oxide-nitride-oxide barrier blocks implant ions and prevents source and body regions from being formed, thus allowing for subsequent implementation of a Schottky diode in that area.

Figure 25S:
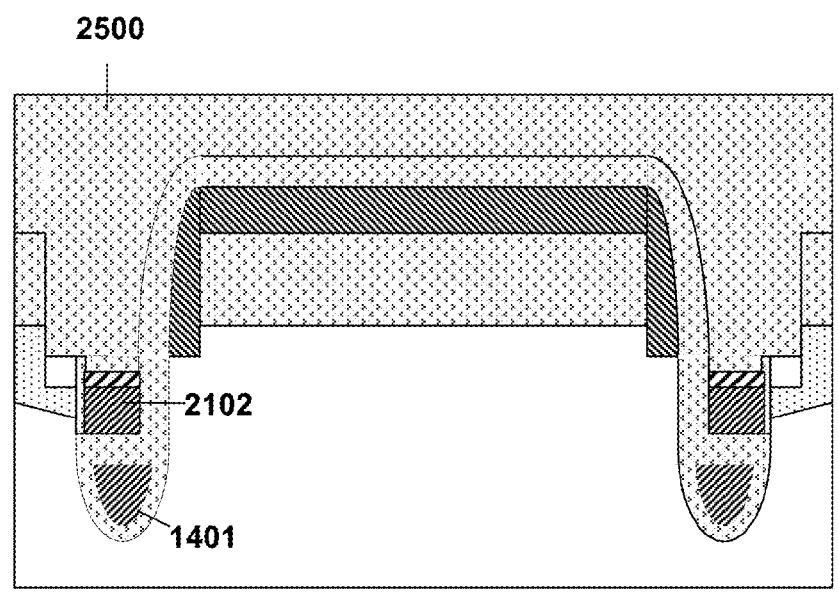

In FIG. 25SS', oxide 2500 ranging from about 5000 Å to about 8000 Å is deposited through to fill trench openings and block gate poly 2102 and poly 1 regions 1401. In some embodiments, a chemical vapor deposition (CVD) process is used to deposit Low Temperature Oxide (LTO) and Boron Phosphorus Silicate Glass (BPSG) to a thickness of approximately 5000 Å.

Figure 26S:
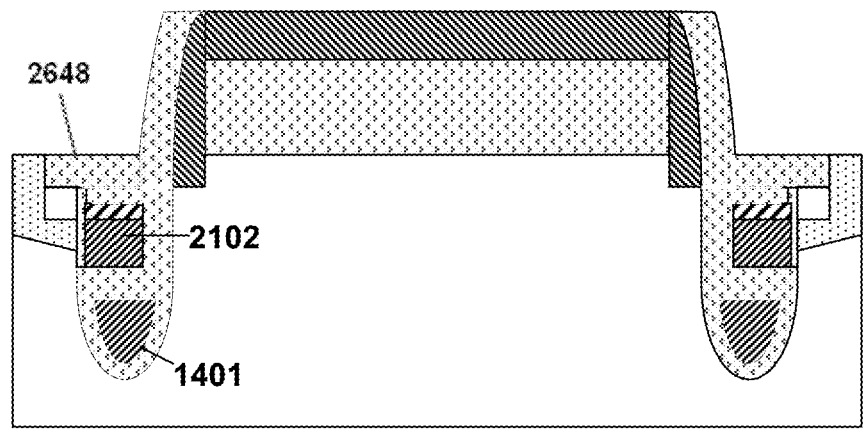

In FIG. 26SS', the oxide is etched back through a dry etch process where the oxide is etched down and stopped by end-point etch on the active cell silicon surface. The oxide covering the termination region is sometimes referred to herein as the termination protection region. In particular, oxide layer covering the termination/gate runner trenches 1102 is part of the termination protection region 2648. The oxide layer atop the nitride layer at the Schottky mesa is removed during this process.

Figure 27S:
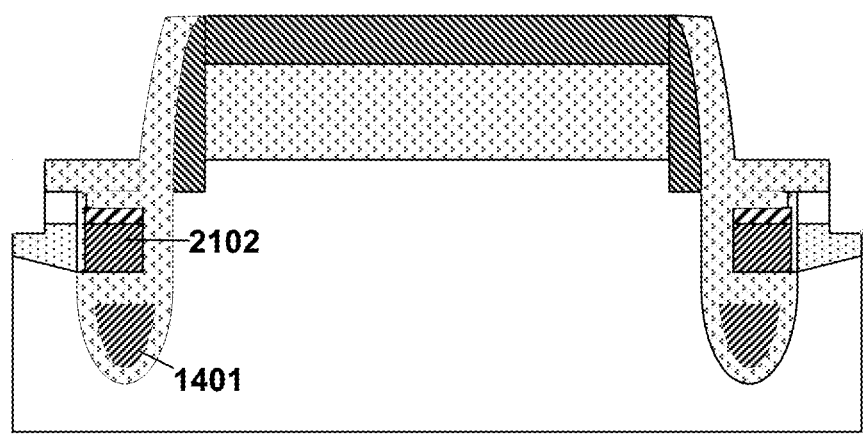

A silicon blanket etch takes place and the results are illustrated in FIG. 27SS'. The silicon etch depth ranges about 0.6 µm to about 0.8 µm depending on the initial trench etch depth of trench 902 of FIG. 9SS'. Exposed silicon areas are etched, while areas protected by oxide and/or nitride are not etched. Since the etching process does not require an additional mask, it is referred to as a self-aligned contact process.

Figure 4:
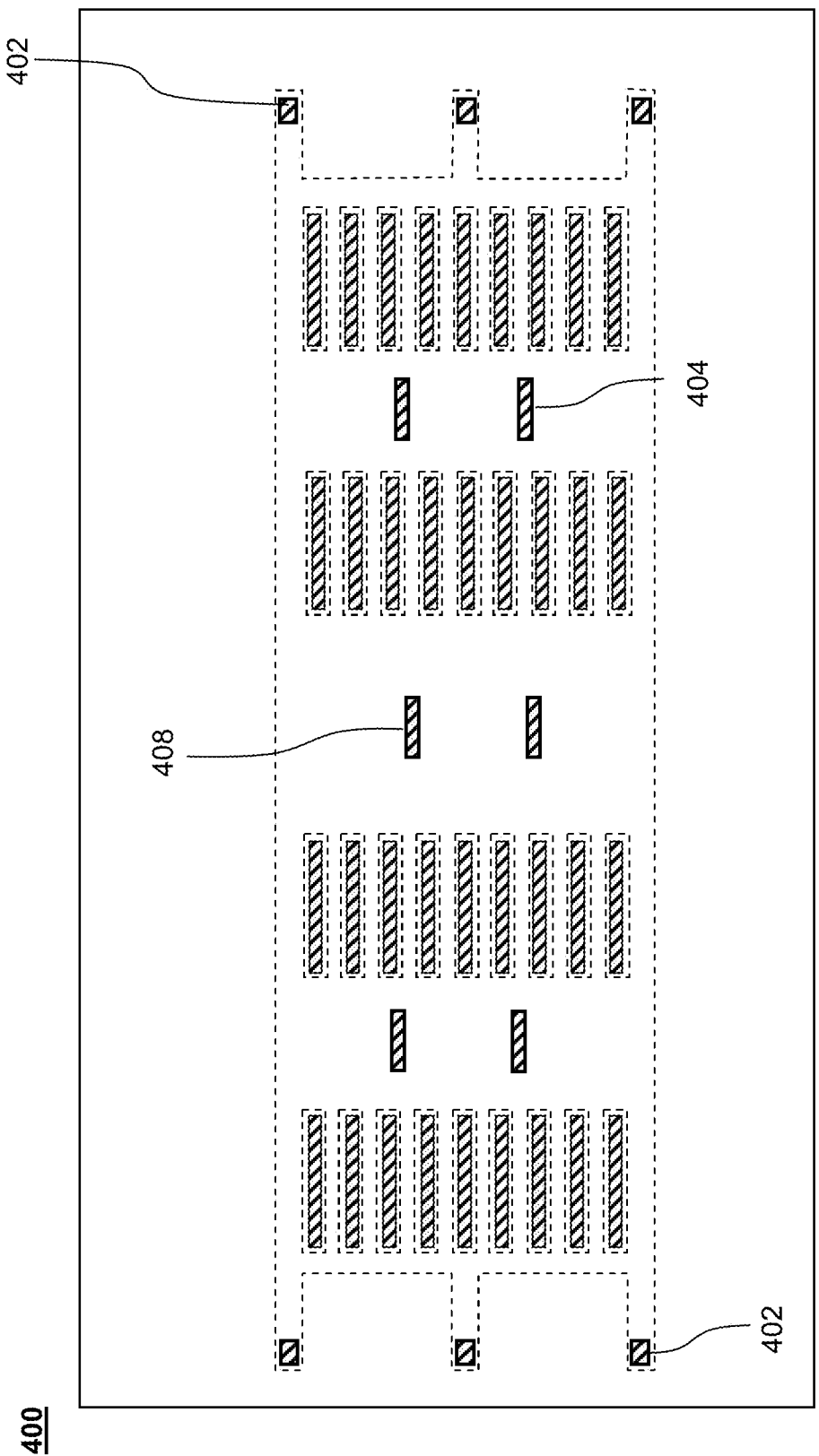
FIG. 4 is a diagram illustrating an example of a third mask used in the fabrication process for fabricating an integrated structure of the type depicted in FIG. 1A.

Another layer of PR is applied and a third mask is used. FIG. 4 is a diagram illustrating an example of a third mask 400. The third mask 400 is also referred to as a poly pickup mask or contact mask. In this example, features that are masked include gate poly pickup contacts such as 402, source poly pickup contacts such as 404, and Schottky contacts such as 408.

Figure 28S:
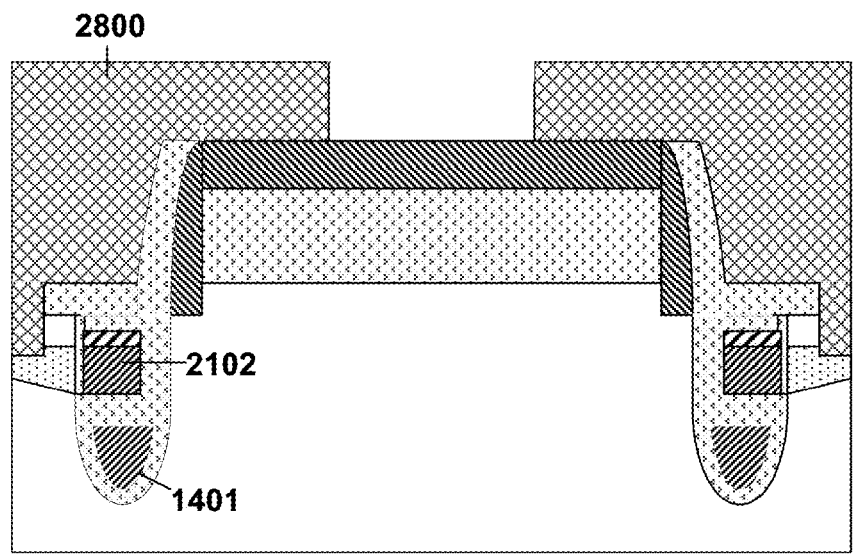

In FIG. 28SS', contact patterns are formed by removing exposed PR 2800. Contact openings are formed over the Schottky contacts as illustrated in FIG. 28SS'.

Figure 29S:
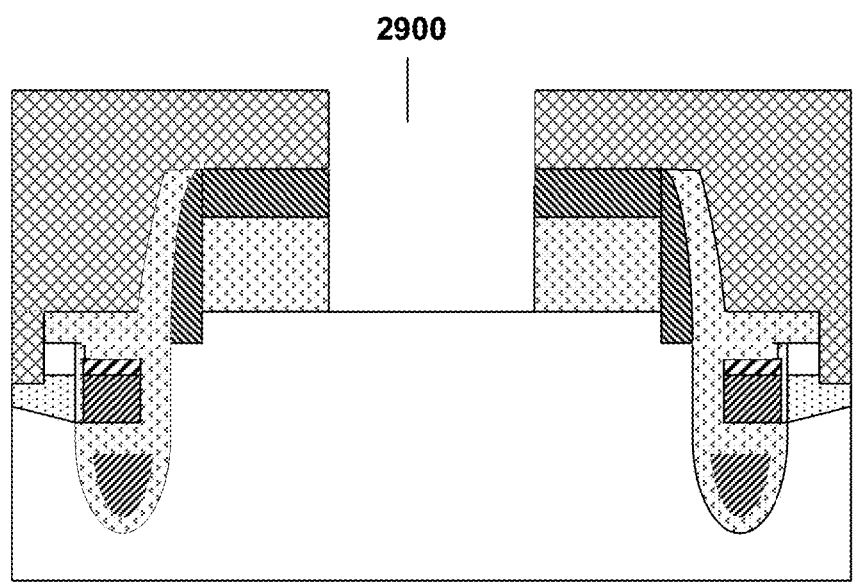

Next, a wet or dry etch is performed to remove the exposed nitride layer formed in the contact opening. Additionally, the exposed oxide layer in the contact opening is also removed to allow for formation of the Schottky diode. FIG. 29SS' illustrates the Schottky contact opening 2900 after removal of the exposed nitride and oxide layers.

Figure 30S:
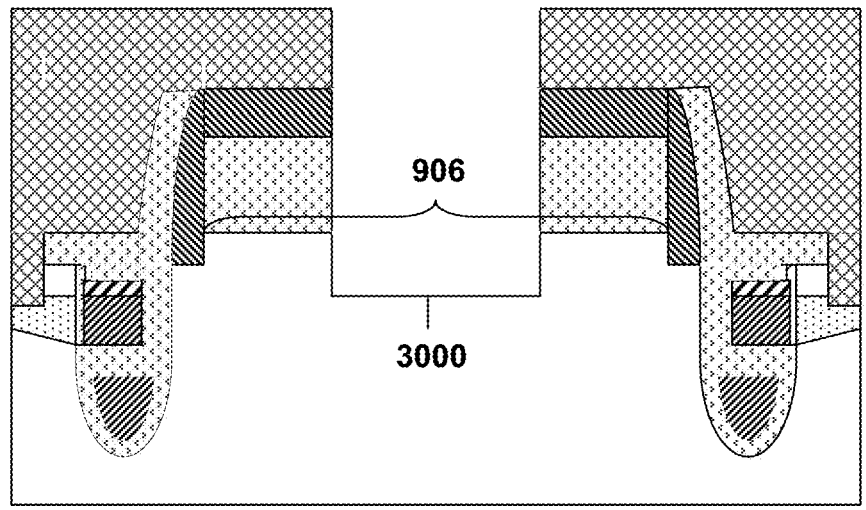

The Schottky diode may be formed at the surface of the Schottky mesa, or alternatively may be formed within a well formed within the Schottky mesa 906. FIG. 30SS' illustrates the optional step of performing a silicon etch at the surface of the Schottky mesa 906 to create a well 3000 wherein the Schottky diode may be formed. It is important to note that the Schottky diode could be formed within the integrated structure without performing this step.

Figure 31S:
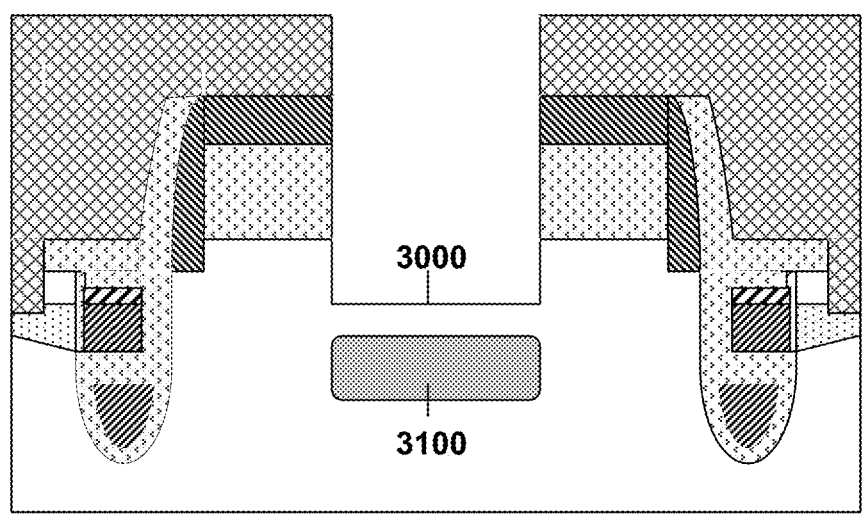

Prior to formation of the Schottky diode, a deep pocket implant is performed at the Schottky contact opening, such that a doped shielding region 3100 is formed below the well 3000 as illustrated in FIG. 31SS'. The energy and dosage of the doped ions may be adjusted to ensure that the doped shielding region 3100 is formed below the exposed surface of the well 3000. By way of example, and not by way of limitation, the doped shielding region may be p-type. The doped shielding region 3100 acts to suppress reverse leakage current during switching of the device.

Figure 32S:
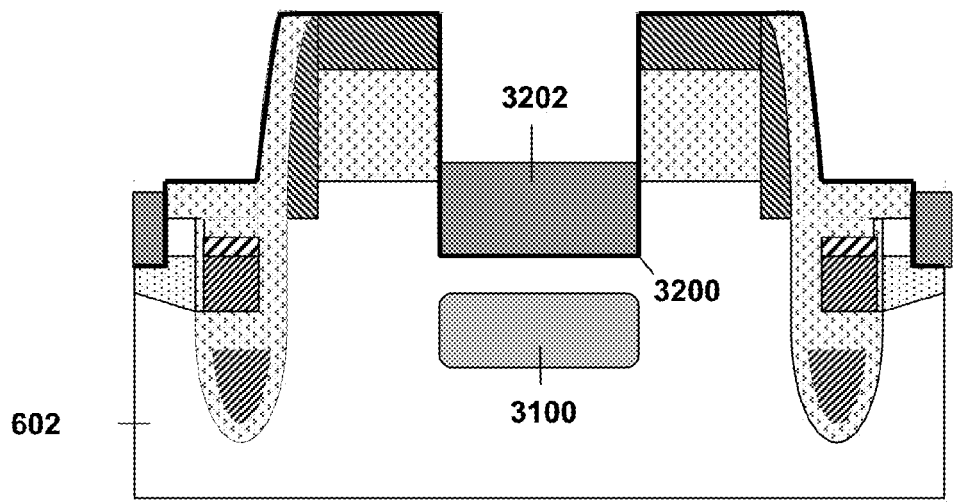

PR is then removed. Barrier metal 3200 such as Ti and TiN are deposited as illustrated in FIG. 32SS'. A Schottky junction is formed at the exposed surface of the well 3000. The barrier metal 3200 forms the anode of the Schottky diode and the substrate 602 forms the cathode of the Schottky diode. The thicknesses of Ti and TiN used varies depending on the application. W is then deposited over the barrier metal. In some embodiments about 4000 Å to about 6000 Å of W is deposited. The deposited W is etched back up to the oxide surface to form individual W plugs 3202. Tungsten plugs 3202 act as a conductor for the subsequently deposited source metal layer and gate metal layer.

Figure 5:
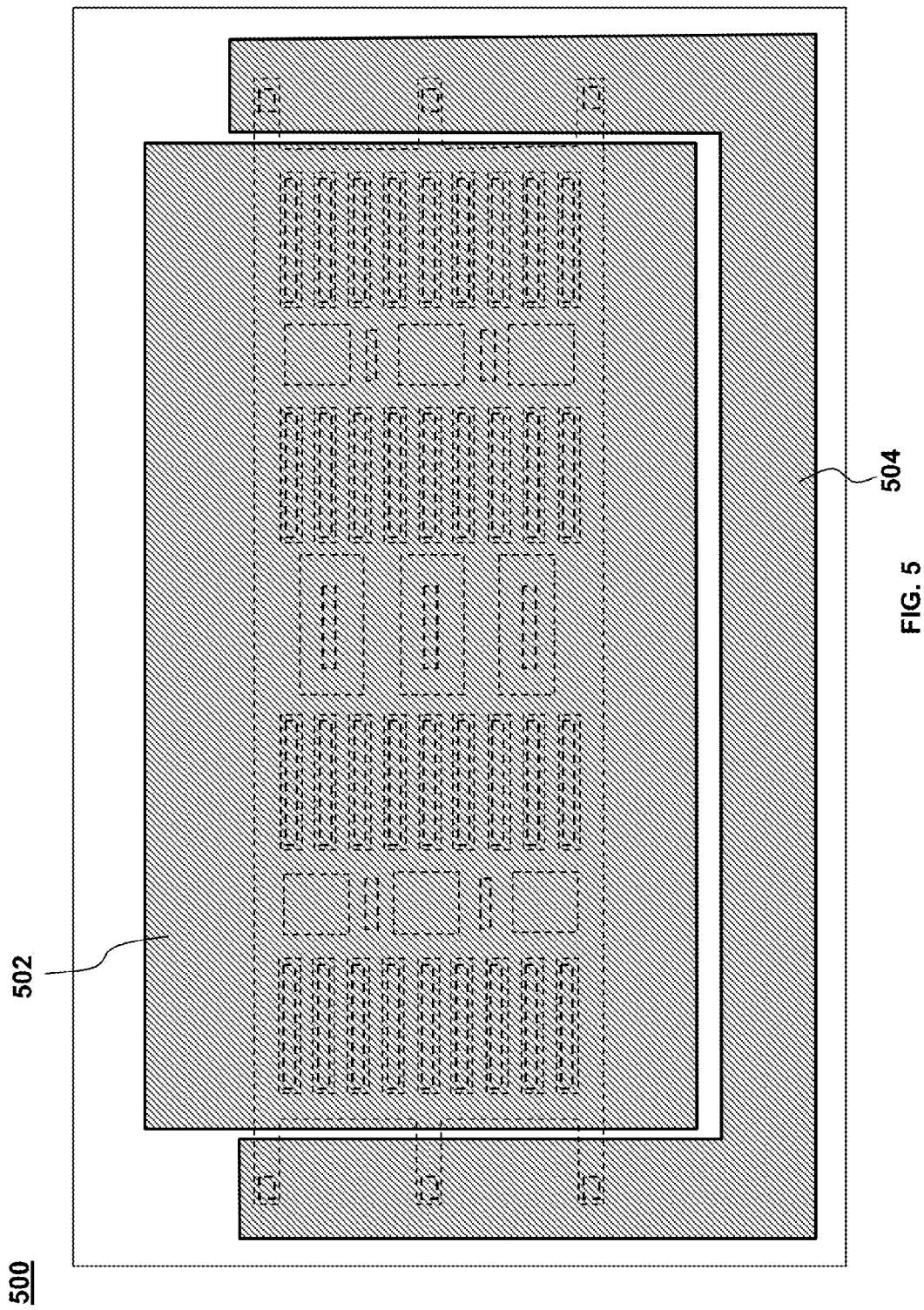
FIG. 5 is a diagram illustrating an example of a fourth mask used in the fabrication process for fabricating an integrated structure of the type depicted in FIG. 1A.

A fourth mask is used to form a source metal region and a gate metal region, and to make contacts at the appropriate locations. FIG. 5 is a diagram illustrating an example of a fourth mask 500, also referred to as a metal mask 500. Shaded regions 502 and 504 correspond to the source metal and the gate metal, respectively. The un-shaded portion corresponds to metal portion that is etched away to separate the source metal region and the gate metal region.

Figure 33S:
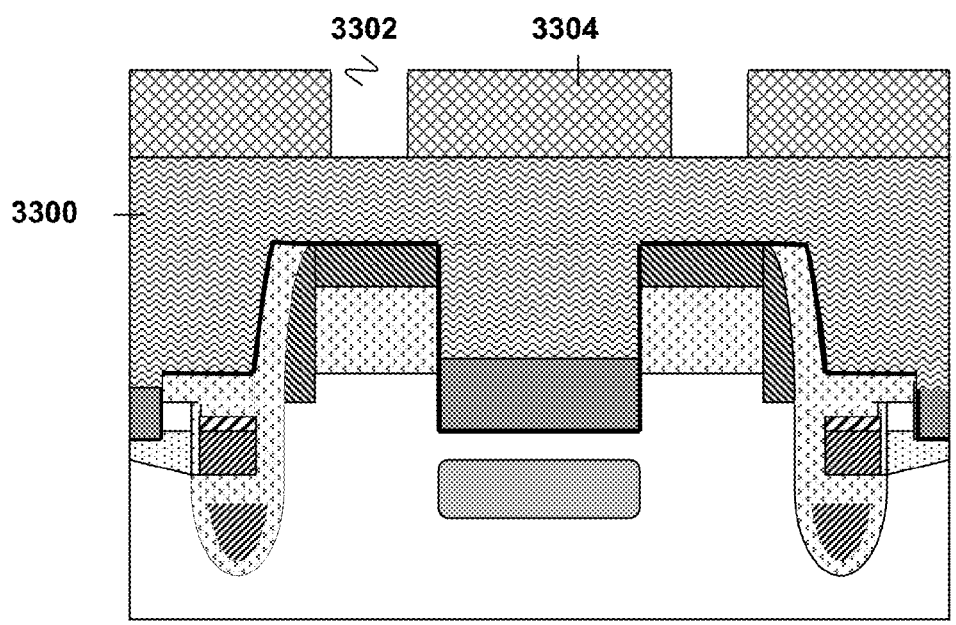

In FIG. 33SS', a metal layer 3300 is deposited. In some embodiments, AlCu is used to form a metal layer that is approximately 3 µm to 8 µm thick. PR 3304 is then deposited and exposed using the metal mask. Metal 3300 in exposed regions such as 3302 is etched away.

Figure 34S:
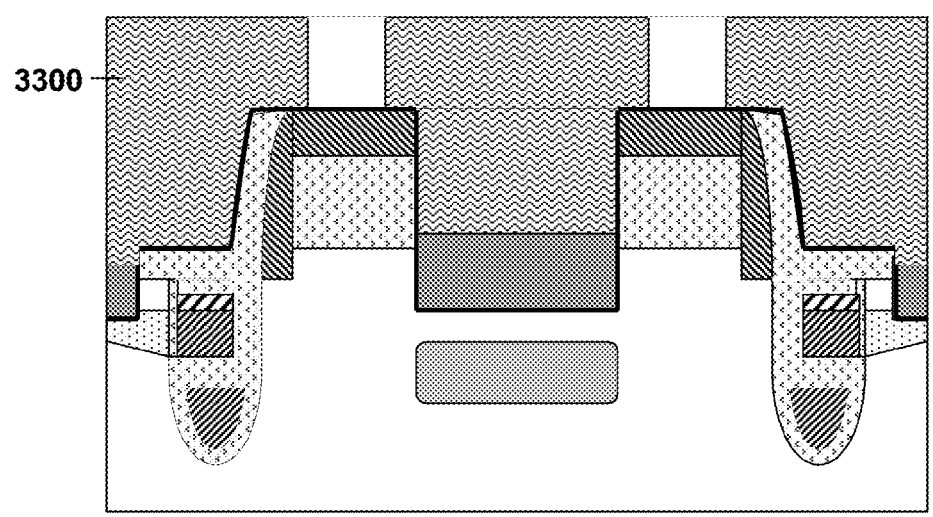

The residual PR layer is removed, and the metal 3304 is annealed. In some embodiments, the metal is annealed at 450° C. for 30 minutes. FIG. 34SS' illustrate a cross sectional view of the final structure with a Schottky diode positioned between two termination trenches.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A semiconductor device, comprising:
   a) a first and second trenches on a substrate that define a mesa of a first conductivity type having a first width between the first and second trenches;
   b) an insulated source electrode formed in the first and second trenches;
   c) a dielectric region formed in at least a portion of the first and second trenches insulating the insulated source electrode from the mesa, wherein a portion of the dielectric region fills a top portion of the first and second trenches;
   d) a dielectric layer formed on a top surface of the mesa having a contact opening through the dielectric layer; and
   e) a surface source electrode electrically connected to the insulated source electrode overlaying the dielectric layer and filling the contact opening forming a Schottky junction at an interface with the mesa.

2. The semiconductor device of claim 1, wherein the contact opening further comprises a contact trench extending to a first depth into the mesa.

3. The semiconductor device of claim 1, wherein the contact opening has a width less than the first width.

4. The semiconductor device of claim 1, further comprising an insulated gate electrode formed in the first and second trenches overlying the insulated source electrode, wherein the insulated gate electrode is electrically isolated from the insulated source electrode by a portion of the dielectric region.

5. The semiconductor device of claim 1, further comprising a floating doped region of a second conductivity type formed in the first conductivity mesa aligned to the contact opening.

6. The semiconductor device of claim 5, wherein the second conductivity type is opposite to the first conductivity type.

7. The semiconductor device of claim 5, wherein the floating doped region of the second conductivity type has a width substantially the same as the width of the contact opening.

8. The semiconductor device of claim 5, wherein the contact opening further comprises a contact trench extending to a first depth into the mesa and the floating doped region of the second conductivity type is formed in the mesa at a second depth deeper than the first depth.

9. A semiconductor device, comprising:
   a) a first and second trenches on a substrate that define a mesa of a first conductivity type having a first width between the first and second trenches;
   b) an insulated shielding electrode formed in the first and second trenches;
   c) a dielectric region formed in at least a portion of the first and second trenches insulating the insulated shielding electrode from the mesa, wherein a portion of the dielectric region filling a top portion of the first and second trenches;
   d) a dielectric layer formed on a top surface of the mesa having a contact opening through the dielectric layer, wherein the contact opening further comprising a contact trench extending to a first depth into the mesa having an entire sidewall and a bottom surrounded by the mesa of the first conductivity type; and
   e) a surface electrode overlaying the dielectric layer and filling the contact trench forming a Schottky junction at an interface with the mesa.

10. The semiconductor device of claim 9, further comprising an insulated gate electrode formed in the first and second trenches overlying the insulated source electrode, wherein the insulated gate electrode is electrically isolated from the insulated source electrode by a portion of the dielectric region.

11. The semiconductor device of claim 9, wherein the insulated shielding electrode being electrically connected to the surface electrode.

12. The semiconductor device of claim 9, further comprising a floating doped region of second conductivity type formed in the first conductivity mesa aligned to the contact trench.

13. The semiconductor device of claim 12, wherein the second conductivity type is opposite to the first conductivity type.

14. The semiconductor device of claim 12, wherein the floating doped region of second conductivity type having a width substantially the same as the contact trench.

* * * * *